United States Patent
Naik et al.

(10) Patent No.: US 10,749,531 B1
(45) Date of Patent: Aug. 18, 2020

(54) MULTI-MODULUS FREQUENCY DIVIDER CIRCUIT

(71) Applicant: Synopsys, Inc., Mountain View, CA (US)

(72) Inventors: Sanket Naik, Bangalore (IN); Akarsh Joshi, Bangalore (IN); Gopal Krishna Ullal Nayak, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/673,835

(22) Filed: Nov. 4, 2019

(30) Foreign Application Priority Data

Sep. 16, 2019 (IN) .............................. 201941037225

(51) Int. Cl.
| | | |
|---|---|---|
| H03K 23/66 | (2006.01) | |
| H03K 23/68 | (2006.01) | |
| H03K 21/02 | (2006.01) | |
| H03K 21/10 | (2006.01) | |
| H03L 7/197 | (2006.01) | |

(52) U.S. Cl.
CPC ........... *H03K 23/68* (2013.01); *H03K 21/026* (2013.01); *H03K 21/10* (2013.01); *H03K 23/66* (2013.01); *H03L 7/1974* (2013.01)

(58) Field of Classification Search
CPC ...... H03K 21/026; H03K 21/10; H03K 23/66; H03K 23/667; H03K 23/68; H03L 7/1974
See application file for complete search history.

(56) References Cited

U.S. PATENT DOCUMENTS

| | | | | |
|---|---|---|---|---|
| 7,196,559 B2* | 3/2007 | Chien | ................... | H03K 23/667 |
| | | | | 327/115 |
| 7,760,844 B2* | 7/2010 | Ding | ..................... | H03K 23/584 |
| | | | | 377/47 |
| 8,675,810 B2* | 3/2014 | Martin | ................. | H03K 23/667 |
| | | | | 377/47 |
| 9,018,988 B2* | 4/2015 | Abdel-Haleem | ....... | H03L 7/193 |
| | | | | 327/115 |
| 9,118,333 B1* | 8/2015 | Mika | ...................... | H03K 23/70 |
| 9,577,646 B1* | 2/2017 | Pandita | ................... | H03L 7/197 |
| 9,900,012 B2* | 2/2018 | Cali | ..................... | H03K 21/026 |

* cited by examiner

*Primary Examiner* — Patrick O Neill
(74) *Attorney, Agent, or Firm* — Fenwick & West LLP

(57) ABSTRACT

A multi-modulus frequency divider circuit includes first and second frequency division stages. The first frequency division stage receives a first input clock signal having a first oscillating frequency, a first modulus input signal, and a first division bit. The first frequency division stage divides the first oscillating frequency by a first division ratio, and generates a second input clock signal having a second oscillating frequency. The second frequency division stage receives the second input clock signal, a second modulus input signal, and a second division bit. The second frequency division stage generates an output clock signal having an output oscillating frequency by dividing the second oscillating frequency by a second division ratio.

25 Claims, 9 Drawing Sheets

MULTI-MODULUS FREQUENCY DIVIDER CIRCUIT

CROSS REFERENCE TO RELATED APPLICATIONS

This application claims the right of priority based on India Provisional Application Serial No. 201941037225, entitled "Multi-Modulus Frequency Divider Circuit", filed Sep. 16, 2019, which is incorporated by reference in its entirety.

TECHNICAL FIELD

The present disclosure relates generally to the field of electronic circuits, and, more particularly, to a multi-modulus frequency divider circuit.

BACKGROUND

Synchronous digital circuits employ periodically oscillating signals, i.e., clock signals for coordinating various functions performed by the synchronous digital circuits. Synchronous digital circuits also employ the clock signals for sampling data. The clock signals are typically generated by a clock generating circuit, such as a ring current controlled oscillator, an inductor-capacitor voltage controlled oscillator (VCO), and the like. The clock signals that are employed by the synchronous digital circuits have oscillating frequencies ranging from a few Giga Hertz (GHz) to a few kilo Hertz (kHz).

To generate the clock signals at various frequencies, synchronous digital circuits typically employ a phase locked loop (PLL) for generating the clock signals. The PLL includes a clock generator circuit, a phase-frequency detector (PFD), a loop filter, a VCO, and a frequency divider circuit. The clock generating circuit generates a reference clock signal that has a reference oscillating frequency. The clock generating circuit is further connected to the PFD, and outputs the reference clock signal thereto. The PFD determines a phase difference between the reference clock signal and a division clock signal. Based on the phase difference between the reference clock signal and the division clock signal, the PFD generates a reference current, and outputs the reference current to the loop filter. The loop filter integrates the reference current, and generates a controlling voltage. The VCO receives the controlling voltage and generates a VCO clock signal that has a VCO oscillating frequency. The frequency divider circuit is connected between the VCO and the PFD. The frequency divider divides the VCO oscillating frequency by a division factor, and generates the division clock signal. Hence, the PLL controls the VCO oscillating frequency based on the division clock signal.

The frequency divider can be implemented as a multi-modulus frequency divider circuit. Prior multi-modulus frequency divider circuits have a high delay along their critical paths, which run on the highest frequency clock for the circuits. A higher delay can cause the frequency divider to generate the output clock signal erroneously due to a smaller margin for error in the critical stage timing, which leads to erroneous sampling of the data in synchronous digital circuits.

SUMMARY

In one embodiment of the present disclosure, a multi-modulus frequency divider circuit is provided. The multi-modulus frequency divider circuit includes first and second frequency division stages. The first frequency division stage includes a modulus generation circuit and a first flip-flop. The modulus generation circuit receives a first division bit of a set of division bits, a first input clock signal at a first oscillating frequency, and a first modulus input signal. The modulus generation circuit generates a first modulus output signal. Each division bit of the set of division bits corresponds to one of a set of division ratios, e.g., a division ratio of either 2 or 3. The first modulus output signal is generated by dividing the first oscillating frequency by the division ratio represented by the first division bit. The first flip-flop receives a delayed version of the first input clock signal and a first flip-flop input signal, and generates a second input clock signal at a second oscillating frequency. The first flip-flop input signal is generated based on the first modulus output signal. In some embodiments, the first flip-flop input signal is generated by a first logic gate of the first frequency division stage that is connected to the modulus generation circuit. The second frequency division stage includes a divider cell that receives a second division bit of the set of division bits and a second modulus input signal. The divider cell is connected to the first frequency division stage and receives the second input clock signal. The divider cell generates a second modulus output signal and an output clock signal at a third oscillating frequency by dividing the second oscillating frequency by the division ratio represented by the second division bit. The first modulus input signal is generated based on the second modulus output signal.

In some embodiments, the modulus generation circuit included in the first frequency division stage includes a first set of flip-flops, a second set of flip-flops, a second logic gate, and an additional flip-flop. The first set of flip-flops receives the first division bit of the set of division bits and the first input clock signal at the first oscillating frequency, and generates a first division output signal. The second set of flip-flops receives the first input clock signal and the first modulus input signal, and generates first and second flip-flop output signals. The first logic gate is connected to the second set of flip-flops. The first logic gate receives the first and second flip-flop output signals, and outputs a pulse signal. The additional flip-flop receives the first input clock signal. The additional flip-flop is also connected to the first set of flip-flops and the first logic gate for receiving the first division output signal and the pulse signal, respectively. The additional flip-flop generates the first modulus output signal based on the output of the first set of flip-flops and a pulse signal generated by the second set of flip-flops. When the output of the first set of flip-flops is at a low logic state (e.g. a value of 0), the additional flip-flop stays in reset and keeps the first modulus output signal at a low logic state. When the output of the first set of flip-flops is at a high logic state, the first modulus output signal is set to a high logic state for one cycle of the first input clock signal after the pulse signal generated by the second set of flip-flops changes to a high logic state for one cycle of the first input clock signal.

Various embodiments of the present disclosure provide a multi-modulus frequency divider circuit. The multi-modulus frequency divider circuit includes first and second frequency division stages. The first multi-modulus frequency divider circuit receives a first input clock signal having a first oscillating frequency and a first division bit of a set of division bits. The first frequency division stage divides the first oscillating frequency by a first division ratio of a set of division ratios, the first division ratio corresponding to the first division bit. The first frequency division stage further generates a second input clock signal having a second oscillating frequency. The second frequency division stage receives a second division bit of the set of division bits. The second frequency division stage divides the second oscillating frequency by a second division ratio corresponding to the second division bit. The second frequency division stage further generates an output clock signal having a third oscillating frequency. The first frequency division stage includes a flip-flop, a buffer, a logic gate, and a modulus generation circuit. The second frequency division stage includes a divider cell and a pulse stretcher.

The modulus generation circuit receives the first division bit and the first input clock signal. The modulus generation circuit is further connected to the pulse stretcher and receives a first modulus input signal. The modulus generation circuit generates and outputs a first modulus output signal to the logic gate. The logic gate is connected to the flip-flop and receives the second input clock signal therefrom. The logic gate generates a first flip-flop input signal based on the first modulus output signal and the second input clock signal. The logic gate outputs the first flip-flop input signal to the flip-flop. The buffer receives the first input clock signal, delays the first input clock signal, and generates a delayed version of the first input clock signal. The buffer outputs the delayed version of the first input clock signal to the flip-flop. The flip-flop generates the second input clock signal. The flip-flop is connected to the divider cell, and outputs the second input clock signal to the divider cell. The divider cell further receives the second division bit and a second modulus input signal. The divider cell generates the output clock signal and a second modulus output signal. The divider cell is connected to the pulse stretcher and outputs the second modulus output signal thereto. The pulse stretcher generates the first modulus output signal, and outputs the first modulus output signal to the modulus generation circuit.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

As used in the specification and claims, the singular forms "a", "an" and "the" include plural references unless the context clearly dictates otherwise. For example, the term "an article" may include a plurality of articles unless the context clearly dictates otherwise.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the disclosed embodiments.

There may be additional components described in the foregoing application that are not depicted on one of the described drawings. In the event such a component is described, but not depicted in a drawing, the absence of such a drawing should not be considered as an omission of such design from the specification.

Before describing the present disclosure in detail, it should be observed that the present disclosure utilizes a combination of circuit components which constitutes a frequency divider circuit. Accordingly, the components and the method steps have been represented, showing only specific details that are pertinent for an understanding of the present disclosure so as not to obscure the disclosure with details that will be readily apparent to those with ordinary skill in the art having the benefit of the description herein.

As required, detailed embodiments of the present disclosure are disclosed herein; however, it is to be understood that the disclosed embodiments are merely exemplary of the disclosure, which can be embodied in various forms. Therefore, specific structural and functional details disclosed herein are not to be interpreted as limiting, but merely as a basis for the claims and as a representative basis for teaching one skilled in the art to variously employ embodiments of the present disclosure in virtually any appropriately detailed structure. Further, the terms and phrases used herein are not intended to be limiting but rather to provide an understandable description of the embodiments herein.

Figure 1:
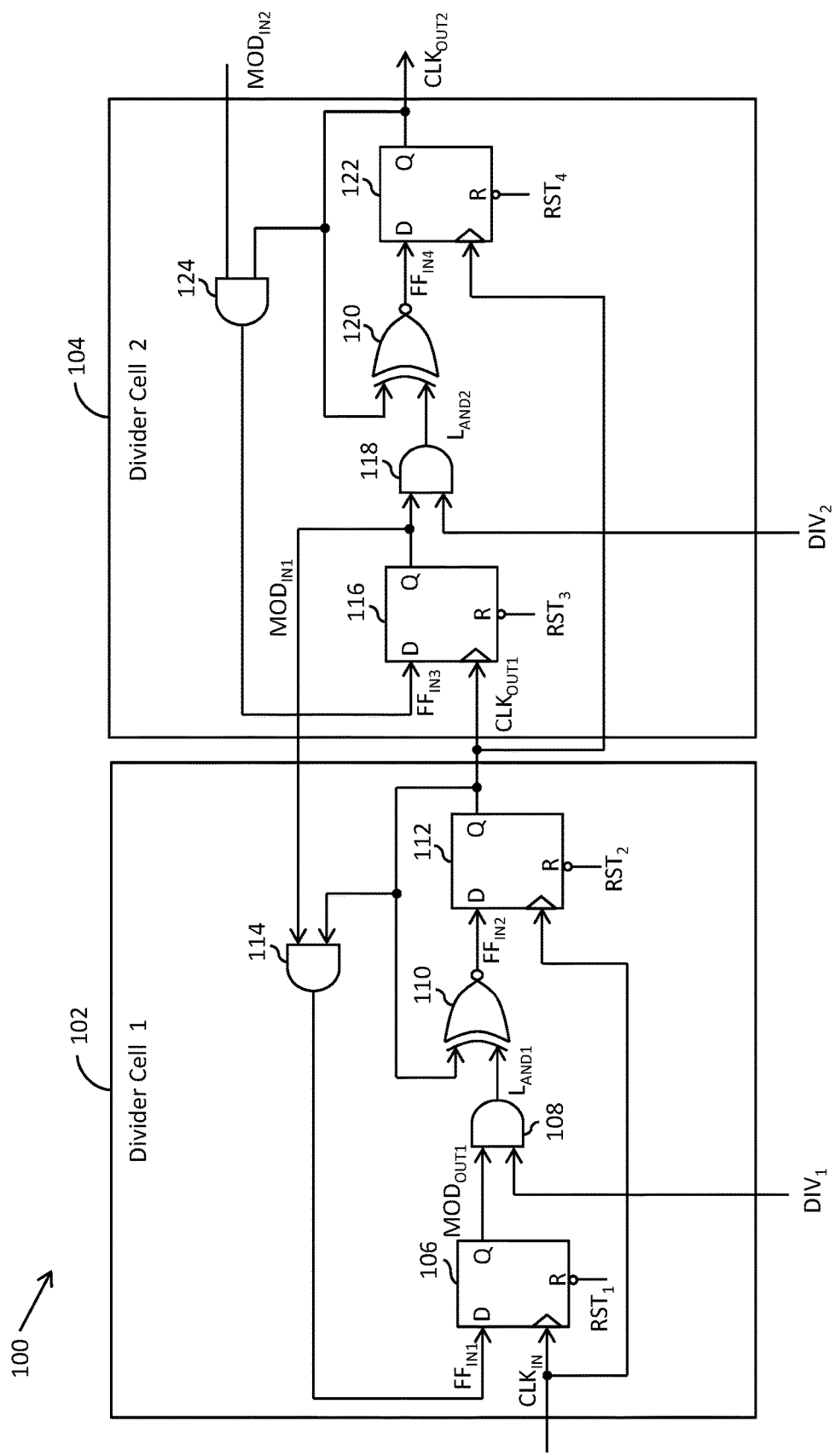
FIG. 1 is a schematic block diagram of two interconnected divider cells of a conventional multi-modulus frequency divider circuit.

FIG. 1 shows a schematic block diagram of two interconnected divider cells of one example of a conventional prior art multi-modulus frequency divider circuit 100. The multi-modulus frequency divider circuit 100 includes first and second divider cells 102 and 104. The first divider cell 102 receives an input clock signal $CLK_{IN}$ that has a first oscillating frequency and generates a first output clock signal $CLK_{OUT1}$ at a second oscillating frequency by dividing the first oscillating frequency by one of a set of division ratios (such as 2 and 3). Similarly, the second divider cell 104 receives the first output clock signal $CLK_{OUT1}$ and generates a second output clock signal $CLK_{OUT2}$ at a third oscillating frequency by dividing the second oscillating frequency (i.e., the frequency of $CLK_{OUT1}$) by one of the set of division ratios.

The first divider cell 102 includes a first flip-flop 106, a first AND gate 108, a first exclusive NOR (XNOR) gate 110, a second flip-flop 112, and a second AND gate 114. The first flip-flop 106 receives the input clock signal $CLK_{IN}$ and a first flip-flop input signal $FF_{IN1}$ and generates a first modulus output signal $MOD_{OUT1}$. The first AND gate 108 receives the first modulus output signal $MOD_{OUT1}$ and a first division input signal $DIV_1$. The first AND gate 108 outputs a first AND output signal $L_{AND1}$. The first XNOR gate 110 is connected to the first AND gate 108 and receives the first AND output signal $L_{AND1}$. The first XNOR gate 110 further receives the first output clock signal $CLK_{OUT1}$. Based on the first AND output signal $L_{AND1}$ and the first output clock signal $CLK_{OUT1}$, the first XNOR gate 110 outputs a second flip-flop input signal $FF_{IN2}$. The second flip-flop 112 receives the input clock signal $CLK_{IN}$, and is connected to the first XNOR gate 110 for receiving the second flip-flop input signal $FF_{IN2}$. The second flip-flop 112 generates the first output clock signal $CLK_{OUT1}$. The second AND gate 114 receives the first output clock signal $CLK_{OUT1}$ and a first modulus input signal $MOD_{IN1}$. The second AND gate 114 outputs the first flip-flop input signal $FF_{IN1}$. The first divider cell 102 divides the first oscillating frequency by the division ratio (such as 2 or 3) indicated by the first division input signal $DIV_1$.

The second divider cell 104 includes a third flip-flop 116, a third AND gate 118, a second XNOR gate 120, a fourth flip-flop 122, and a fourth AND gate 124. The third flip-flop 116 receives the first output clock signal $CLK_{OUT1}$ and a third flip-flop input signal $FF_{IN3}$ and generates the first modulus input signal $MOD_{IN1}$. The third AND gate 118 receives the first modulus input signal $MOD_{IN1}$ and a second division input signal $DIV_2$. The third AND gate 118 outputs a second AND output signal $L_{AND2}$. The second XNOR gate 120 receives the second output clock signal $CLK_{OUT2}$, and is connected to the second AND gate 118 to receive the second AND output signal $L_{AND2}$. The second XNOR gate 120 outputs a fourth flip-flop input signal $FF_{IN4}$. The fourth flip-flop 122 receives the first output clock signal $CLK_{OUT1}$, and is connected to the second XNOR gate 120 for receiving the fourth flip-flop input signal $FF_{IN4}$. The fourth flip-flop 122 further generates the second output clock signal $CLK_{OUT2}$. The fourth AND gate 124 receives the second output clock signal $CLK_{OUT2}$ and a second modulus input signal $MOD_{IN2}$. The fourth AND gate 124 outputs the third flip-flop input signal $FF_{IN3}$. The second divider cell 104 divides the first oscillating frequency by the division ratio (such as 2 or 3) indicated by the second division input signal $DIV_2$.

The first, second, third, and fourth flip-flops 106, 112, 116, and 122 each have a setup time of $T_{setup}$. Further, the first, second, third, and fourth flip-flops 106, 112, 116, and 122 each have a clock-to-q delay time of $T_{clk-to-q}$. The first, second, third, and fourth AND gates 108, 114, 118, and 124 each have a gate delay time of $T_{AND}$. The first and second XNOR gates 110 and 120 each have a gate delay time of $T_{XNOR}$. A first critical time $TC_1$ of the multi-modulus frequency divider circuit 100 is a time at which the first flip-flop 106 provides the $MOD_{OUT1}$ to an input of the second flip-flop 112. The first critical time $TC_1$ is given by equation (1):

$$TC_1 = T_{clk-to-q} + T_{AND} + T_{XNOR} + T_{setup} \quad (1)$$

A second critical time $TC_2$ of the multi-modulus frequency divider circuit 100 is a time period between a time at which the second flip-flop 112 generates the first output clock signal $CLK_{OUT1}$ and a time at which the second AND gate 114 outputs the first flip-flop input signal $FF_{IN1}$. The second critical time $TC_2$ is given by equation (2):

$$TC_2 = 2 \times T_{clk-to-q} + T_{AND} + T_{setup} \quad (2)$$

The total critical time $TC_{tot}$ representing the delay along the critical path of the multi-modulus frequency divider circuit 100 is a sum of the first and second critical times $TC_1$ and $TC_2$. The total critical time $T_{tot}$ is given by equation (3):

$$T_{tot} = TC_1 + TC_2 \quad (3)$$

Thus, if either the first critical time $TC_1$ or the second critical time $TC_2$ is greater than the clock period of $CLK_{IN}$, the first output clock signal $CLK_{OUT1}$ is erroneously generated. This results in an incorrect division ratio between input and output clocks and a malfunctioning of the multi-modulus frequency divider circuit 100, leading to erroneous sampling of the data in the synchronous digital circuits. Further, in this scenario, the multi-modulus frequency divider circuit 100 may not generate the second output clock signal $CLK_{OUT2}$ at the third oscillating frequency Hence, it would be advantageous to have a multi-modulus frequency divider circuit that has a lower total critical time as compared to multi-modulus frequency divider circuit 100, generates the second output clock signal accurately, and prevents erroneous sampling of data, e.g., of synchronous circuits.

Figure 2:
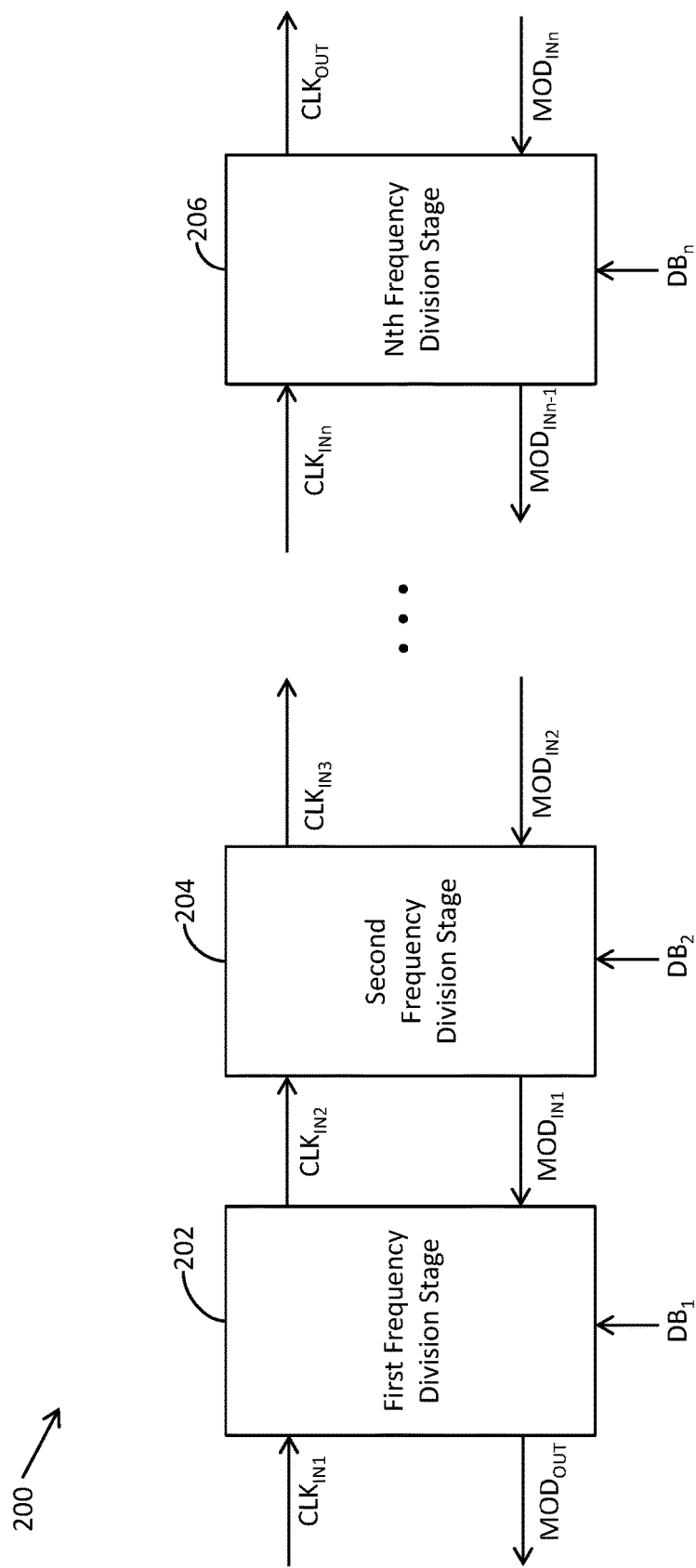
FIG. 2 is a schematic block diagram of a multi-modulus frequency divider circuit in accordance with an example embodiment.

Referring now to FIG. 2, illustrated is a schematic block diagram of a multi-modulus frequency divider circuit 200 in accordance with an example embodiment. The multi-modulus frequency divider circuit 200 receives a first input clock signal $CLK_{IN1}$ from a clock generator (not shown). The clock generator may be a clock generating circuit such as a voltage controlled oscillator, a current controlled oscillator, or the like. The first input clock signal $CLK_{IN1}$ has a first oscillating frequency, which may be in the range of gigahertz (GHz). The multi-modulus frequency divider circuit 200 receives a set of division bits, of which three division bits, $DB_1$, $DB_2$, and $DBn$, are shown. The multi-modulus frequency divider circuit 200 generates an output clock signal $CLK_{OUT}$ by dividing the first oscillating frequency with a division factor. The division factor may be an integer or a fraction. In one example, the division factor is 40, an integer. In another example, the division factor is 10.5, a fraction. The output clock signal $CLK_{OUT}$ has an output oscillating frequency. The output oscillating frequency is given by equation (1):

$$Fout = Fin/\text{Division Factor} \quad (1)$$

where Fout is the oscillating frequency output by the multi-modulus frequency divider circuit 200 and Fin is the first oscillating frequency input to the multi-modulus frequency divider circuit 200. The set of division bits is a binary representation of the division factor. In one example, the division factor is 8, and each division bit represents either a 2 (represented by a value of 0) or a 3 (represented by a value of 1). In this example, the multi-modulus frequency divider circuit 200 receives the set of division bits as 000. In particular, the set of division bits 000 indicates that the first oscillating frequency is divided by 2 three times, i.e., the first oscillating frequency is divided by 8. Further, a most significant bit (MSB) of the binary representation of the division factor is input to the multi-modulus frequency divider circuit 200 as the signal $MOD_{INn}$. In the example with a division factor of 8, the MSB of the binary representation of the division factor is 1, and a 1 is input to the nth frequency division stage 206 as $MOD_{INn}$.

The multi-modulus frequency divider circuit 200 includes multiple frequency division stages, of which three frequency division stages 202-206 are shown: first frequency division stage 202, second frequency division stage 204, and nth frequency division stage 206. Any number of frequency division stages may be included. For example, the multi-modulus frequency divider circuit 200 has n frequency division stages, as shown in FIG. 2. In some embodiments, the multi-modulus frequency divider circuit 200 has three frequency division stages, with the nth frequency division stage 206 being a third frequency division stage, and the second frequency division stage 204 connecting to the nth frequency division stage 206. In another example, the multi-modulus frequency divider circuit 200 has only two frequency division stages; in this example, the nth frequency division stage 206 is omitted, and the second frequency division stage 204 outputs $CLK_{OUT}$. In other examples, one or more additional frequency division stages are included between the second frequency division stage 204 and the nth frequency division stage 206.

The frequency division stages 202-206 are serially connected. The first frequency division stage 202 receives the first input clock signal $CLK_{IN1}$. The first frequency division stage 202 further receives the first division bit $DB_1$, and is connected to the next frequency division stage—here, the second frequency division stage 204—for receiving a first modulus input signal $MOD_{IN1}$. Based on the first division bit $DB_1$, the first frequency division stage 202 divides the first oscillating frequency by one of the set of division ratios to generate a second input clock signal $CLK_{IN2}$ having a second oscillating frequency. In one embodiment, the set of division ratios includes 2 and 3. If the first division bit $DB_1$ is 0, the first frequency division stage 202 divides the the first oscillating frequency by 2. If the first division bit $DB_1$ is 1 and the first modulus input signal $MOD_{IN1}$ is also 1, the first frequency division stage 202 divides the first oscillating frequency by 3. The first frequency division stage 202 and outputs the second input clock signal $CLK_{IN2}$ to the next frequency division stage—here, the second frequency division stage 204. The first frequency division stage 202 also generates a modulus output signal $MOD_{OUT}$.

The second through the nth frequency division stages, including the second frequency division stage 204 and the nth frequency division stage 206 shown in FIG. 2, are functionally similar to the first frequency division stage 202. The second frequency division stage 204 is connected to the first frequency division stage 202 to receive the second input clock signal $CLK_{IN2}$. The second frequency division stage 204 further receives a second modulus input signal $MOD_{IN2}$ and the second division bit $DB_2$. Based on the second input clock signal $CLK_{IN2}$, the second modulus input signal $MOD_{IN2}$, and the second division bit $DB_2$, the second frequency division stage 204 generates a third input clock signal $CLK_{IN3}$ having a third oscillating frequency. The second frequency division stage 204 further generates the first modulus input signal $MOD_{IN1}$. Similarly, the third frequency division stage 206 receives a fourth input clock signal $CLK_{INn}$, a third modulus input signal $MOD_{INn}$, and the third division bit $DB_n$. The third frequency division stage 206 generates the output clock signal $CLK_{OUT}$ having the output oscillating frequency, and a fourth modulus input signal $MOD_{INn-1}$.

The multi-modulus frequency divider circuit 200 may further be connected to a sigma-delta modulator (SDM) (not shown), in cases where the division factor is a fractional or non-integer value. The SDM receives a decimal value of the division factor. The SDM converts the decimal value of the division factor to a binary representation of the division factor, and generates a sequence of division bits (also referred to herein as a "set of division bits") $DB_1$, $DB_2$, ... $DB_N$. The pulse density of the sequence of division bits output from the SDM is based on the decimal value of the division factor. For example, if the division factor is 8.5, the SDM may generate a sequence of division bits that represents the sequence 8, 9, 8, 9 over a single operation period of the SDM. The use of an SDM in the multi-modulus frequency divider circuit 200 is discussed in further detail, with respect to FIGS. 8 and 9. The generated sequence of division bits $DB_1$, $DB_2$, ..., $DB_N$ is provided to the first through Nth frequency division stages, respectively.

The multi-modulus frequency divider circuit 200 may be employed in phase locked loop (PLL) circuits and high speed clock synthesizer circuits for providing the output clock signal $CLK_{OUT}$ thereto. The output clock signal $CLK_{OUT}$ is further used by the SERDES circuits for sampling serial data. The multi-modulus frequency divider circuit 200 may further be used in conjunction with high speed digital communication circuits for providing the output clock signal $CLK_{OUT}$ thereto.

Figure 3:
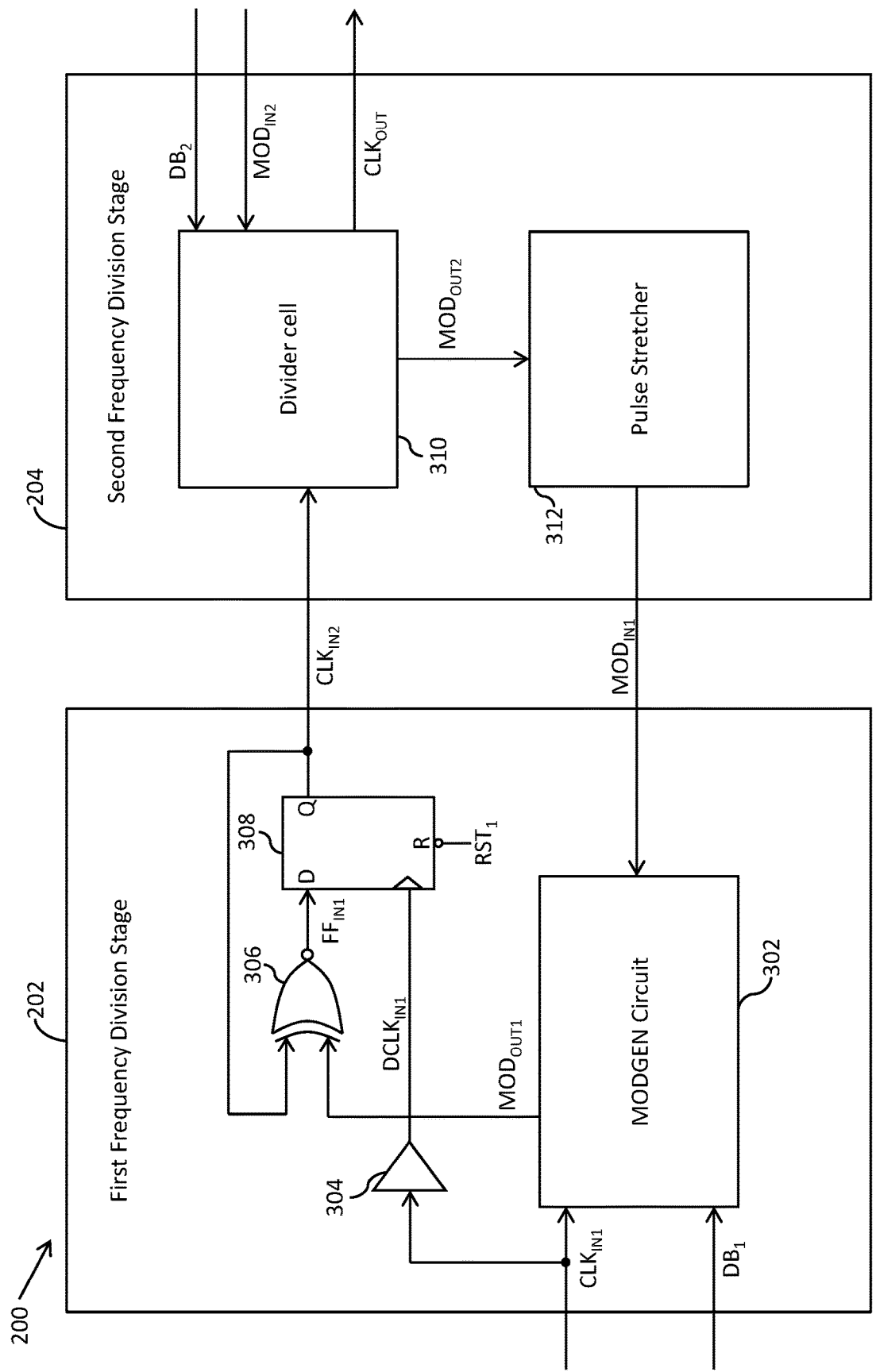
FIG. 3 is a schematic block diagram of the multi-modulus frequency divider circuit of FIG. 2 that includes first and second frequency division stages in accordance with an example embodiment.

Referring now to FIG. 3, a schematic block diagram of an embodiment of the multi-modulus frequency divider circuit 200 that includes the first and second frequency division stages 202 and 204 is shown. The embodiment of the multi-modulus frequency divider circuit 200 shown in FIG. 3 includes two frequency division stages, in which the second frequency division stage 204 generates the output clock signal $CLK_{OUT}$. The first frequency division stage 202 includes a modulus generation (MODGEN) circuit 302, a buffer 304, a first exclusive NOR (XNOR) gate 306, and a first flip-flop 308. In one embodiment, the first flip-flop 308 is a D flip-flop. The second frequency division stage 204 includes a divider cell 310 and a pulse stretcher 312. Functioning of the MODGEN circuit 302 and the divider cell 310 is explained in detail in conjunction with FIGS. 4 and 5, respectively.

The MODGEN circuit 302 is connected to the clock generator (not shown) and receives the first input clock signal $CLK_{IN1}$ therefrom. The MODGEN circuit 302 further receives the first division bit $DB_1$. The MODGEN circuit 302 is further connected to the second frequency division stage 204 to receive the first modulus input signal $MOD_{IN1}$. The MODGEN circuit 302 generates a first modulus output signal $MOD_{OUT1}$. In one scenario, the first division bit $DB_1$ is 0 and the first modulus input signal $MOD_{IN1}$ is at a logic low state. In this scenario, the MODGEN circuit 302 generates the first modulus output signal $MOD_{OUT1}$ at low logic state, and the first flip-flop 308 divides the first oscillating frequency (i.e., the frequency of $CLK_{IN1}$) by the first division ratio, e.g., 2. In another scenario, the $DB_1$ is 1 and the MODGEN circuit 302 is not in reset. When a transition from a logic low state to a high logic state in the first modulus input signal $MOD_{IN1}$ is detected, the MODGEN circuit generates a pulse for 1 clock cycle of $CLK_{IN1}$. As a result, the first flip-flop 308 divides the first oscillating frequency by a division ratio equal to 3 for 1 clock cycle of $CLK_{IN1}$. Thus, the first frequency division stage 202 divides the first oscillating frequency by the corresponding division ratio.

The buffer 304 receives the first input clock signal $CLK_{IN1}$. The buffer 304 delays the first input clock signal $CLK_{IN1}$ by a first propagation delay time, and generates a delayed version of the first input clock signal $DCLK_{IN1}$, hereinafter referred to as a "delayed first input clock signal $DCLK_{IN1}$". The first propagation delay time of the buffer 304 may be based on the structural design of the buffer 304, or the buffer 304 may have a variable time period and be programmed with the first propagation delay time.

The first XNOR gate 306 is connected to the MODGEN circuit 302 and receives the first modulus output signal $MOD_{OUT1}$ therefrom. The first XNOR gate 306 is connected to the first flip-flop 308 to receive the second input clock signal $CLK_{IN2}$, which is output by the first flip-flop 308. The first XNOR gate 306 performs an XNOR operation on the first modulus output signal $MOD_{OUT1}$ and the second input clock signal $CLK_{IN2}$. Based on the XNOR operation, the first XNOR gate 306 outputs a first flip-flop input signal $FF_{IN1}$ to the first flip-flop 308. When the first modulus output signal $MOD_{OUT1}$ is at low logic state, the first XNOR gate 306 acts as an inverter, outputting an inverted version of the second input clock signal $CLK_{IN2}$ as the first flip-flop input signal $FF_{IN1}$. When the first modulus output signal $MOD_{OUT1}$ is at high logic state, the first XNOR gate 306 acts as a buffer and outputs the second input clock signal $CLK_{IN2}$ as the first flip-flop input signal $FF_{IN1}$.

A clock terminal of the first flip-flop 308 is connected to the buffer 304 and receives the delayed first input clock signal $DCLK_{IN1}$. An input terminal of the first flip-flop 308 is connected to the first XNOR gate 306 to receive the first flip-flop input signal $FF_{IN1}$. The first flip-flop 308 generates the second input clock signal $CLK_{IN2}$ based on the first flip-flop input signal $FF_{IN1}$ and the delayed first input clock signal $DCLK_{IN1}$. When the first flip-flop 308 receives the inverted version of the second input clock signal $CLK_{IN2}$ as the first flip-flop input signal $FF_{IN1}$, the second clock signal $CLK_{IN2}$ toggles between high and low logic states at every rising edge of the delayed first input clock signal $CLK_{IN1}$. When the first flip-flop 308 receives the second input clock signal $CLK_{IN2}$ as the first flip-flop input signal $FF_{IN1}$, the first flip-flop 308 outputs a second clock signal $CLK_{IN2}$ which does not toggle between high and low logic states. The first flip-flop 308 generates the second input clock signal $CLK_{IN2}$ at the second oscillating frequency. The second oscillating frequency is equal to the first oscillating frequency divided by one of the set of division ratios, e.g., 2 or 3.

The divider cell 310 in the second frequency division stage 204 is connected to the first flip-flop 308 in the first frequency division stage 202 to receive the second input clock signal $CLK_{IN2}$. The divider cell 310 further receives the second division bit $DB_2$ and the second modulus input signal $MOD_{IN2}$ from an adjacent frequency division stage. If the divider cell 310 is part of the last frequency division stage in the chain of frequency division stages of the multi-modulus frequency divider circuit 200, the second modulus input signal $MOD_{IN2}$ are set to 1. Based on the second input clock signal $CLK_{IN2}$, the second modulus input signal $MOD_{IN2}$, and the second division bit $DB_2$, the divider cell 310 generates a second modulus output signal $MOD_{OUT2}$, and the output clock signal $CLK_{OUT}$ at the output oscillating frequency. The divider cell 310 is functionally similar to the first frequency division stage 202. Based on the second division bit $DB_2$ and the second modulus input signal $MOD_{IN2}$, the divider cell 310 generates the output clock signal $CLK_{OUT}$ at the output oscillating frequency by dividing the second oscillating frequency by one of the set of division ratios, e.g., 2 or 3.

The pulse stretcher 312 is connected to the divider cell 310 to receive the second modulus output signal $MOD_{OUT2}$. The pulse stretcher 312 increases a duty cycle of the second modulus output signal $MOD_{OUT2}$ and generates the first modulus input signal $MOD_{IN1}$. In one embodiment, the pulse stretcher 312 is a ring counter. It will be apparent to a person skilled in the art that the pulse stretcher 312 may be any circuit that is used for frequency reduction.

Figure 4:
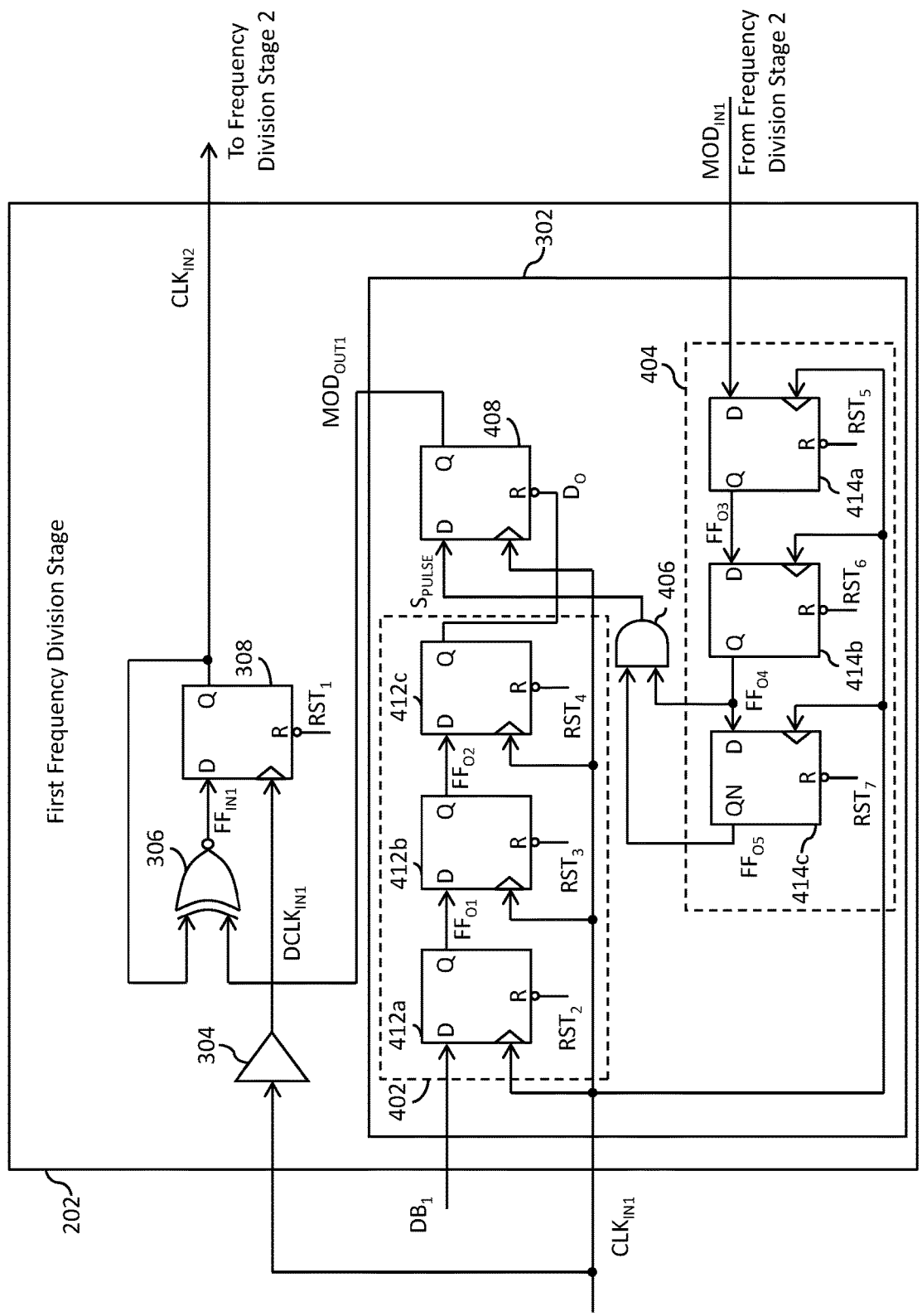
FIG. 4 is a schematic block diagram of the first frequency division stage of FIG. 3, in accordance with an example embodiment.

Referring now to FIG. 4, a schematic block diagram of the first frequency division stage 202, in accordance with an embodiment of the present disclosure is shown. The first frequency division stage 202 includes the MODGEN circuit 302, the buffer 304, the first XNOR gate 306, and the first flip-flop 308. The MODGEN circuit 302 includes a first set of flip-flops 402, a second set of flip-flops 404, a first AND gate 406, and a second flip-flop 408. The first set of flip-flops 402 includes third through fifth flip-flops 412a-412c. The third flip-flop 412a receives the first input clock signal $CLK_{IN1}$ at a clock terminal thereof. The third flip-flop 412a further receives the first division bit $DB_1$ at an input terminal thereof. Since the third flip-flop 412a is synchronous with respect to the first input clock signal $CLK_{IN1}$, the third flip-flop 412a delays the first division bit $DB_1$ by a second propagation delay time, and generates a first flip-flop output signal $FF_{O1}$ at an output terminal thereof. The second propagation delay time is a clock-to-q delay of a D flip-flop, i.e., the clock-to-q delay of one of the third through fifth flip-flops 412a-412c. The fourth flip-flop 412b receives the first input clock signal $CLK_{IN1}$ at a clock terminal thereof. The fourth flip-flop 412b is further connected to the output terminal of the third flip-flop 412a to receive the first flip-flop output signal $FF_{O1}$. The fourth flip-flop 412b delays the first flip-flop output signal $FF_{O1}$ by the second propagation delay time, and generates a second flip-flop output signal $FF_{O2}$ at an output terminal thereof. The fifth flip-flop 412c receives the first input clock signal $CLK_{IN1}$ at a clock terminal thereof. The fifth flip-flop 412c is connected to the output terminal of the fourth flip-flop 412b to receive the second flip-flop output signal $FF_{O2}$. The fifth flip-flop 412c delays the second flip-flop output signal $FF_{O2}$ by the second propagation delay time, and generates a division output signal $D_O$ at an output terminal thereof.

The second set of flip-flops 404 includes sixth through eighth flip-flops 414a-414c. In one embodiment, the sixth through eighth flip-flops 414a-414c are D flip-flops and have a clock-to-q delay that is equal to the second propagation delay time. The sixth flip-flop 414a has an input terminal connected to the pulse stretcher 312 to receive the first modulus input signal $MOD_{IN1}$. The sixth flip-flop 414a receives the first input clock signal $CLK_{IN1}$ at a clock terminal thereof. The sixth flip-flop 414a delays the first modulus input signal $MOD_{IN1}$ by the second propagation delay time and generates a third flip-flop output signal $FF_{O3}$ at an output terminal thereof. The seventh flip-flop 414b has an input terminal connected to the sixth flip-flop 414a to receive the third flip-flop output signal $FF_{O3}$. The seventh flip-flop 414b receives the first input clock signal $CLK_{IN1}$ at a clock terminal thereof. The seventh flip-flop 414b delays the third flip-flop output signal $FF_{O3}$ by the second propagation delay time and generates a fourth flip-flop output signal $FF_{O4}$ at an output terminal thereof. The eighth flip-flop 414c has an input terminal connected to the seventh flip-flop 414b to receive the fourth flip-flop output signal $FF_{O4}$. The eighth flip-flop 414c receives the first input clock signal $CLK_{IN1}$ at a clock terminal thereof. The eighth flip-flop 414c delays the fourth flip-flop output signal $FF_{O4}$ by the second propagation delay time and generates an inverted fifth flip-flop output signal $FF_{O5}$ at an output terminal thereof.

The first AND gate 406 is connected to the output terminals of the seventh and eighth flip-flops 414b and 414c for receiving the fourth and fifth flip-flop output signals $FF_{O4}$ and $FF_{O5}$, respectively. The fourth and fifth flip-flop output signals $FF_{O4}$ and $FF_{O5}$ have a delay of the second propagation delay time therebetween. The first AND gate 406 performs an AND operation of the fourth and fifth flip-flop output signals $FF_{O4}$ and $FF_{O5}$ and outputs a pulse signal $S_{PULSE}$ based on the delay between the fourth and fifth flip-flop output signals $FF_{O4}$ and $FF_{O5}$.

The second flip-flop 408 has an input terminal connected to an output terminal of the first AND gate 406 to receive the pulse signal $S_{PULSE}$. The second flip-flop 408 receives the first input clock signal $CLK_{IN1}$ at a clock terminal thereof. The second flip-flop 408 is further connected to the fifth flip-flop 412c and receives the division output signal $D_O$ at a reset terminal thereof. The second flip-flop 408 generates the first modulus output signal $MOD_{OUT1}$ and outputs the first modulus output signal $MOD_{OUT1}$ to the first XNOR gate 306.

Figure 5:
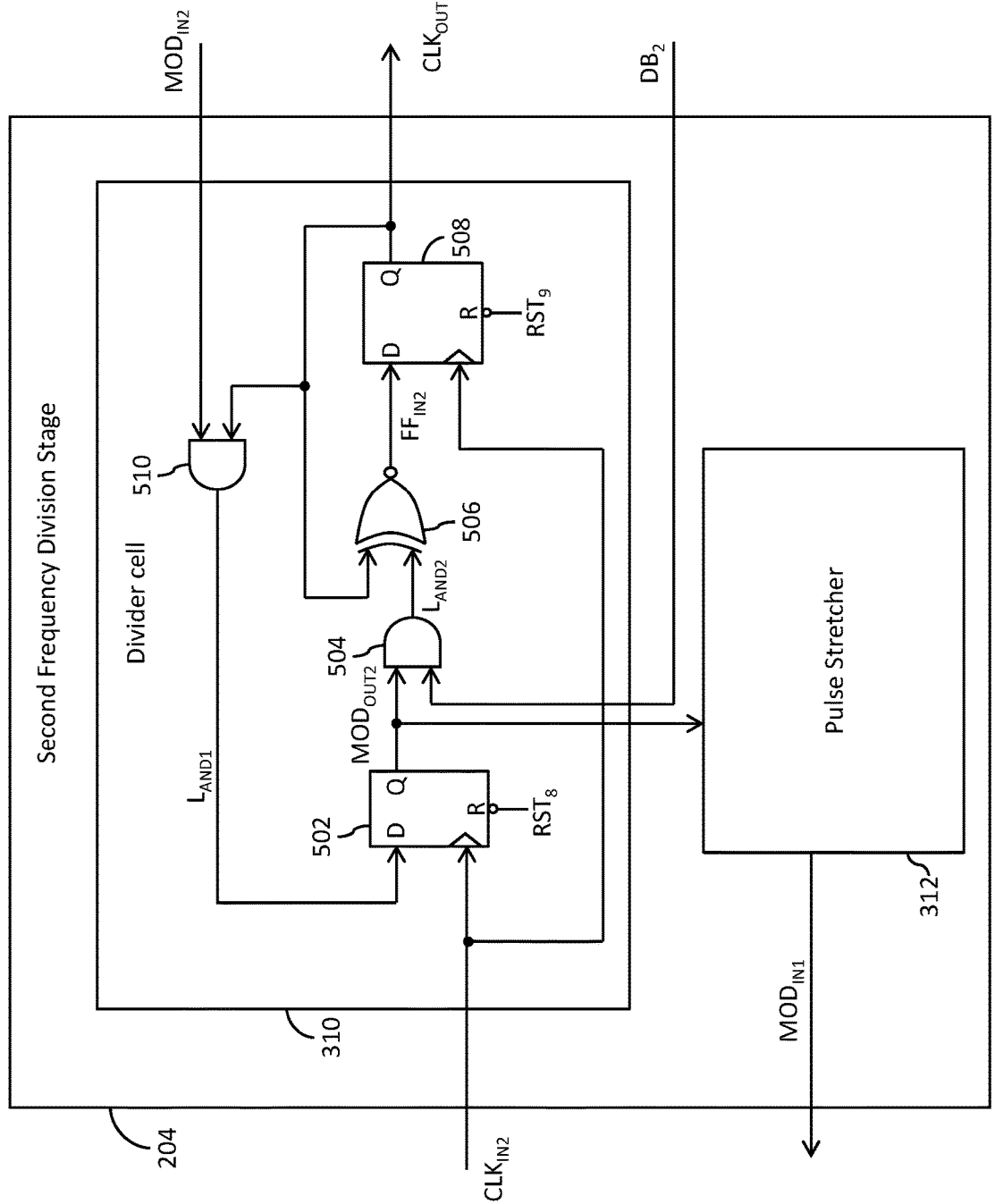
FIG. 5 is a schematic block diagram of the second frequency division stage of FIG. 3, in accordance with an example embodiment.

Referring now to FIG. 5, a schematic block diagram of the second frequency division stage 204, in accordance with an embodiment of the present disclosure is shown. The second frequency division stage 204 includes the divider cell 310 and the pulse stretcher 312. The divider cell 310 includes a ninth flip-flop 502, a second AND gate 504, a second XNOR gate 506, a tenth flip-flop 508, and a third AND gate 510. The ninth flip-flop 502 has a clock terminal connected to the output terminal of the first flip-flop 308 to receive the second input clock signal $CLK_{IN2}$. The ninth flip-flop 502 has an input terminal connected to the third AND gate 510 to receive a first AND output signal $L_{AND1}$. The ninth flip-flop 502 further generates the second modulus output signal $MOD_{OUT2}$ at an output terminal thereof based on the first AND output signal $L_{AND1}$ and the second input clock signal $CLK_{IN2}$.

The second AND gate 504 is connected to the output terminal of the ninth flip-flop 502 to receive the second modulus output signal $MOD_{OUT2}$. The second AND gate 504 further receives the second division bit $DB_2$. The second AND gate 504 performs an AND operation of the second modulus output signal $MOD_{OUT2}$ and the second division bit $DB_2$, and outputs a second AND output signal $L_{AND2}$. When the second division bit $DB_2$ is 0, the second AND output signal $L_{AND2}$ is at low logic state. When the second division bit $DB_2$ is 1, the second AND gate 504 outputs the second modulus output signal $MOD_{OUT2}$ as the second AND output signal $L_{AND2}$.

The second XNOR gate 506 is connected to the second AND gate 504 and receives the second AND output signal $L_{AND2}$ therefrom. The second XNOR gate 506 is further connected to an output terminal of the tenth flip-flop 508 and receives the output clock signal $CLK_{OUT}$ therefrom. The second XNOR gate 506 performs an XNOR operation of the second AND output signal $L_{AND2}$ and the output clock signal $CLK_{OUT}$ and outputs a second flip-flop input signal $FF_{IN2}$. When the second AND output signal $L_{AND2}$ is at low logic state, the second XNOR gate 506 acts as an inverter and outputs the second flip-flop input signal $FF_{IN2}$ as an inverted version of the output clock signal $CLK_{OUT}$. When the second AND output signal $L_{AND2}$ is at high logic state, the second XNOR gate 506 acts as a buffer and outputs the second flip-flop input signal $FF_{IN2}$ as the output clock signal $CLK_{OUT}$.

The tenth flip-flop 508 has a clock terminal connected to the output terminal of the first flip-flop 308 to receive the second input clock signal $CLK_{IN2}$. The tenth flip-flop 508 is further connected to the second XNOR gate 506 and receives the second flip-flop input signal $FF_{IN2}$ at an input terminal thereof. Based on the second input clock signal $CLK_{IN2}$ and the second flip-flop input signal $FF_{IN2}$, the tenth flip-flop 508 generates the output clock signal $CLK_{OUT}$ at the output terminal thereof.

The third AND gate 510 is connected to the output terminal of the tenth flip-flop 508 and receives the output clock signal $CLK_{OUT}$ therefrom. The third AND gate 510 further receives the second modulus input signal $MOD_{IN2}$. The third AND gate 510 performs an AND operation of the output clock signal $CLK_{OUT}$ and the second modulus input signal $MOD_{IN2}$, and outputs the first AND output signal $L_{AND1}$. The third AND gate 510 outputs the first AND output signal $L_{AND1}$ to the input terminal of the ninth flip-flop 502. Since the second modulus input signal $MOD_{IN2}$ corresponds to the most significant bit of the division factor, the second modulus input signal $MOD_{IN2}$ is set at high logic state. Hence, the third AND gate 510 outputs the first AND output signal $L_{AND1}$ as the output clock signal $CLK_{OUT}$.

The first through tenth flip-flops 308, 412a-412c, 414a-414c, 408, 502, and 508 have a setup time of $T_{setup}$. Further, the first through tenth flip-flops 308, 412a-412c, 414a-414c, 408, 502, and 508 have a clock-to-q delay of $T_{clk-to-q}$, which is the second propagation delay time. The first and second XNOR gates 306 and 506 have a gate delay time of $T_{XNOR}$. The first, second, and third AND gates 406, 504, and 510 have a gate delay time of $T_{AND}$. The buffer 304 has a delay time of $T_{buf}$. The delay time $T_{buf}$ of the buffer 304 is equal to the first propagation delay time. The delay time $T_{buf}$ of the buffer 304 may vary based on the design of the buffer 304.

In the example of the prior multi-modulus frequency divider circuit 100 shown in FIG. 1, the total critical time $TC_{tot}$ of the multi-modulus divider circuit 100 is dependent on the first critical time $TC_1$ and the second critical time $TC_2$. The first critical time $TC_1$ is based on a timing of components along a first signal path beginning at an output of the first flip-flop 106, including the first AND gate 108 and the first XNOR gate 110 and ending at an input of the second flip-flop 112. The second critical time $TC_2$ is based a timing of components along a second signal path beginning at an output of the second flip-flop 112, including the third flip-flop 116 and the second AND gate 114, and ending at an input of the first flip-flop 106.

The multi-modulus frequency divider circuit 200 does not have a second signal path, similar to the second signal path of the multi-modulus frequency divider circuit 100. Therefore, a critical time TC of the multi-modulus frequency divider circuit 200 is based on a timing of components along a signal path beginning at an output of the second flip-flop 408, including the first XNOR gate 306, and ending at an input of the first flip-flop 308. The critical time TC of the multi-modulus frequency divider circuit 200 is a time period between an instance when the second flip-flop 408 receives the first input clock signal $CLK_{IN1}$ and an instance when the first flip-flop 308 receives the first flip-flop input signal $FF_{IN1}$. In the case of the multi-modulus frequency divider circuit 200, the first frequency division stage 202 corresponds to the least significant bit (LSB) of the binary representation of the division factor. Since the operation of the first frequency division stage 202 is based on the first input clock signal $CLK_{IN1}$, which has the highest clock frequency of all the input clock signals in the chain of frequency division stages in the multi-modulus frequency divider circuit 200, the critical time TC for the accurate operation of multi-modulus frequency divider circuit 200 is based on the timing of the components in the first frequency division stage 202. The critical time TC for the multi-modulus frequency divider circuit 200 is given by equation (2):

$$TC = T_{clk-to-q} + T_{XNOR} + T_{setup} - T_{buf} \qquad (2)$$

Further, the buffer 304 has a design such that the delay time $T_{buf}$ of the buffer 304 is equal to the gate delay time $T_{XNOR}$ of the first XNOR gate 306. Hence, the critical time TC of the multi-modulus frequency divider circuit 200 is given by equation (3):

$$TC = T_{clk-to-q} + T_{setup} \qquad (3)$$

The critical time TC of the multi-modulus frequency divider circuit 200 is hence equal to a total delay time of the one of the flip-flops, e.g., the first flip-flop 308 or the second flip-flop 408. This significantly simplifies the critical timing of the multi-modulus frequency divider circuit 200 over prior frequency divider circuits, such as the multi-modulus frequency divider circuit 100 shown in FIG. 1. Additionally, the critical time TC of the multi-modulus frequency divider circuit 200 is lower than a period of the first input clock signal $CLK_{IN1}$, resulting in accurate operation of the multi-modulus frequency divider circuit 200.

For the sake of simplicity, the following paragraphs explain operation of the multi-modulus frequency divider circuit 200 when the division factor is 4. However, it will be apparent to a person skilled in the art that the division factor may assume any value other than 4 based on the application of the multi-modulus frequency divider circuit 200. In operation, for a division factor of 4, the second modulus input signal $MOD_{IN2}$ is at high logic state (i.e., 1), the first division bit $DB_1$ is 0, and the second division bit $DB_2$ is 0. Hence, the MODGEN circuit 302 receives the first division bit $DB_1$ as 0. The first set of flip-flops 402 delays the first division bit $DB_1$ and generates the division output signal $D_O$ at low logic state. Since the second flip-flop 408 receives the division output signal $D_O$ at low logic state, the second flip-flop 408 is reset. Hence, the second flip-flop 408 generates the first modulus output signal $MOD_{OUT1}$ at low logic state, and the first XNOR gate 306 receives the first modulus output signal $MOD_{OUT1}$ at low logic state. Hence, the first XNOR gate 306 act as an inverter and outputs the first flip-flop input signal $FF_{IN1}$ as the inverted version of the second input clock signal $CLK_{IN2}$. The buffer 304 receives the first input clock signal $CLK_{IN1}$ and delays the first input clock signal $CLK_{IN1}$ by the first propagation delay time for generating the delayed first input clock signal $DCLK_{IN1}$. The first flip-flop 308 hence receives the delayed first input clock signal $DCLK_{IN1}$ at the clock terminal thereof and receives the inverted version of the second input clock signal $CLK_{IN2}$ from the first XNOR gate 306. The first flip-flop 308 generates the second input clock signal $CLK_{IN2}$ that alternately toggles from high logic state to low logic state, or from low logic state to high logic state, at every rising edge of the first input clock signal $CLK_{IN1}$. Hence, the second oscillating frequency of the second input clock signal $CLK_{IN2}$ is half of the first oscillating frequency of the first input clock signal $CLK_{IN1}$.

The second AND gate 504 receives the second division bit $DB_2$ as 0. The third AND gate 510 receives the second modulus input signal $MOD_{IN2}$ at high logic state. Since the second AND gate 504 receives the second division bit $DB_2$ as 0, the second AND gate 504 outputs the second AND output signal $L_{AND2}$ at low logic state. The second XNOR gate 506 receives the second AND output signal $L_{AND2}$ at low logic state and hence operates as an inverter, outputting the second flip-flop input signal $FF_{IN2}$ as the inverted version of the output clock signal $CLK_{OUT}$. The tenth flip-flop 508 receives the second input clock signal $CLK_{IN2}$ at the clock terminal thereof and the inverted version of the output clock signal $CLK_{OUT}$ at the input terminal thereof. The tenth flip-flop 508 generates the output clock signal $CLK_{OUT}$ that alternately toggles from high logic state to low logic state, or from low logic state to high logic state, at every rising edge of the second input clock signal $CLK_{IN2}$. Hence, the output oscillating frequency is half of the second oscillating frequency. Thus, the output oscillating frequency in this scenario is given by equation (2):

$$F_{OUT} = F_{IN}/4 = F_{intermediate}/2 \qquad (2)$$

where $F_{intermediate}$ is the second oscillating frequency. The second modulus output signal $MOD_{OUT2}$ provided by the ninth flip-flop 502 has the same frequency $F_{OUT}$ as $CLK_{OUT}$.

Figure 6:
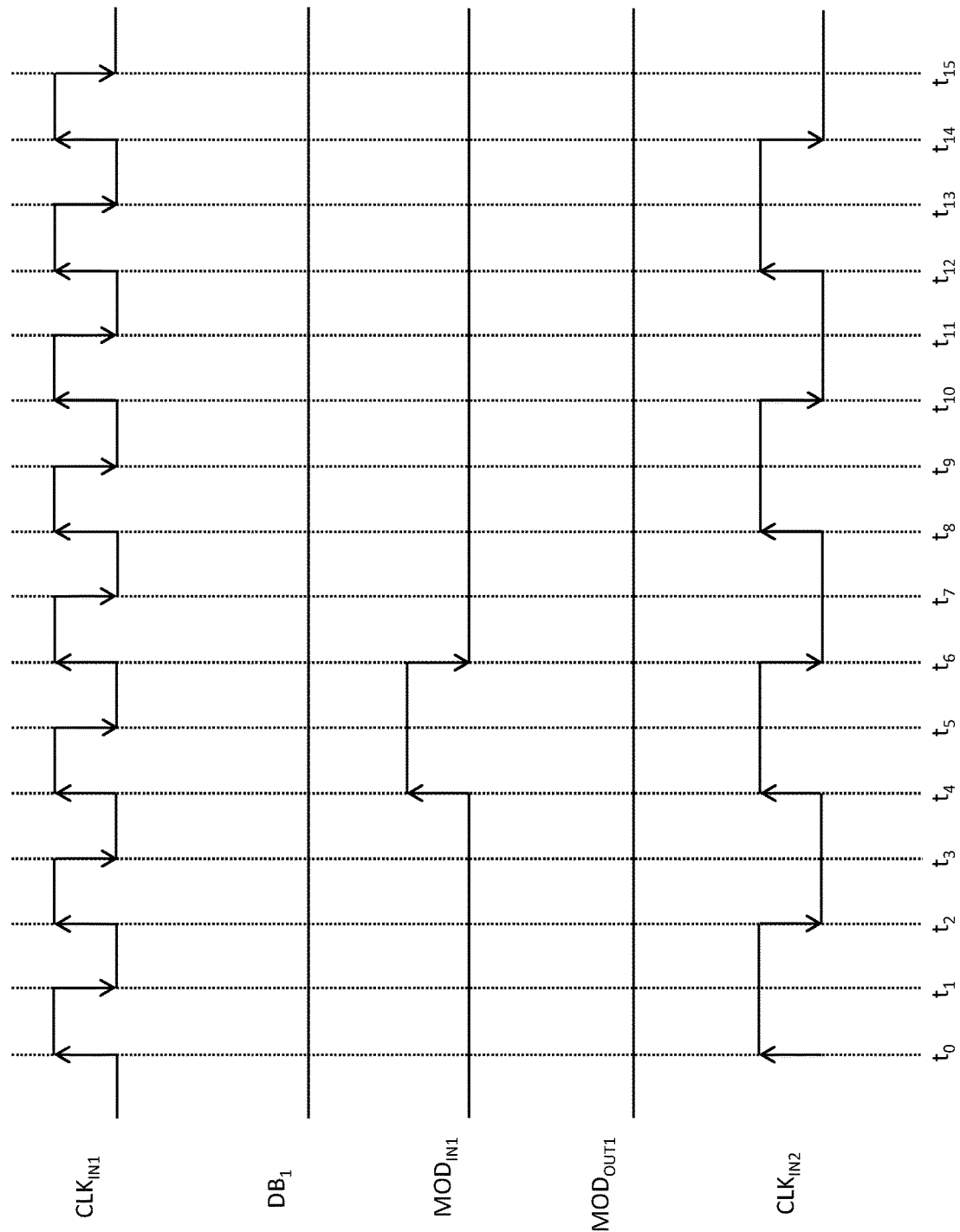
FIG. 6 illustrates a timing diagram illustrating various signals of the first frequency division stage of FIG. 4, in accordance with an example embodiment.

Referring now to FIG. 6, a timing diagram illustrating various signals of the first frequency division stage 202 from a first time instance $t_0$ to a sixteenth time instance $t_{15}$, in accordance with an embodiment of the present disclosure, is shown. The various signals include the first input clock signal $CLK_{IN1}$, the first division bit $DB_1$, the first modulus input signal $MOD_{IN1}$, the first modulus output signal $MOD_{OUT1}$, and the second input clock signal $CLK_{IN2}$. In this embodiment, the first frequency division stage 202 divides the first oscillating frequency by the division ratio 2. The MODGEN circuit 302 receives the first input clock signal $CLK_{IN1}$ from the first time instance $t_0$ to the sixteenth time instance $t_{15}$. Since the first frequency division stage 202 divides the first oscillating frequency by 2, the first set of flip-flops 402 receives the first division bit $DB_1$ as 0, i.e., the first division bit $DB_1$ is at low logic state from the first time instance $t_0$ to the sixteenth time instance $t_{15}$. The second set of flip-flops 404 receives the first modulus input signal $MOD_{IN1}$ at the fifth time instance $t_4$. Based on the first division bit $DB_1$, the second flip-flop 408 generates the first modulus output signal $MOD_{OUT1}$ at a constant value of 0, i.e. the first modulus output signal $MOD_{OUT1}$ is at a low logic state from the first time instance $t_0$ to the sixteenth time instance $t_{15}$. Based on the first modulus output signal $MOD_{OUT1}$, the first flip-flop 308 generates the second input clock signal $CLK_{IN2}$ at the second oscillating frequency.

Figure 7:
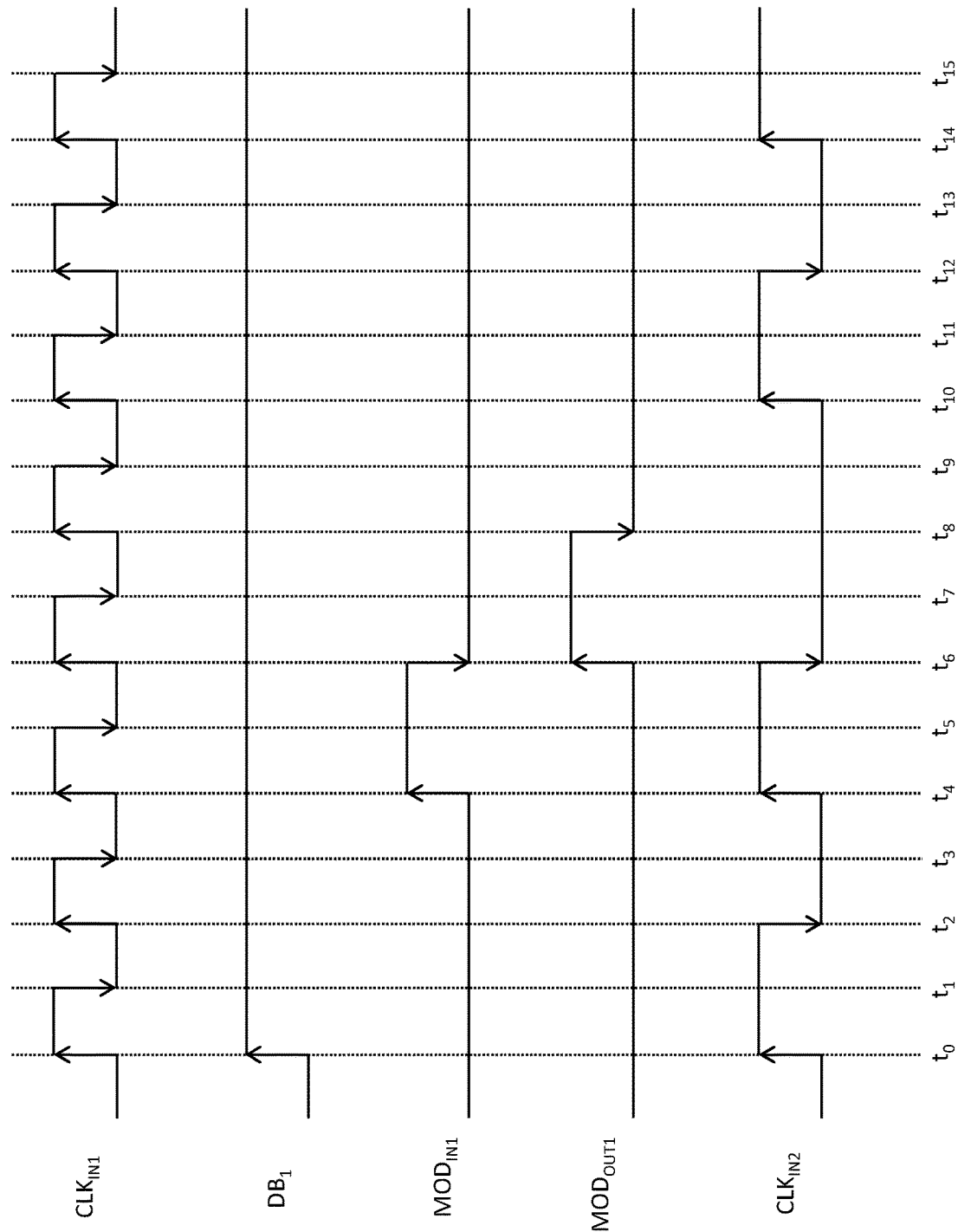
FIG. 7 illustrates a timing diagram illustrating the various signals of the first frequency division stage of FIG. 4, in accordance with another example embodiment.

Referring now to FIG. 7, a timing diagram illustrating various signals of the first frequency division stage 202 from the first time instance $t_0$ to the sixteenth time instance $t_{15}$, in accordance with another embodiment of the present disclosure, are shown. The various signals include the first input clock signal $CLK_{IN1}$, the first division bit $DB_1$, the first modulus input signal $MOD_{IN1}$, the first modulus output signal $MOD_{OUT1}$, and the second input clock signal $CLK_{IN2}$. The MODGEN circuit 302 receives the first input clock signal $CLK_{IN1}$ from the first time instance $t_0$ to the sixteenth time instance $t_{15}$. In this embodiment, the first frequency division stage 202 divides the first oscillating frequency by the division ratio 3, and the first set of flip-flops 402 receives the first division bit $DB_1$ as 1, i.e., the first division bit $DB_1$ is at high logic state from the first time instance $t_0$ to the sixteenth time instance $t_{15}$. The second set of flip-flops 404 receives the first modulus input signal $MOD_{IN1}$ at the fifth time instance $t_4$. Hence, the second flip-flop 408 outputs the first modulus output signal $MOD_{OUT1}$ at high logic state between the seventh and ninth time instances $t_6$ and $t_8$. Hence, the first XNOR gate 306 acts as a buffer between the seventh and ninth time instances $t_6$ and $t_8$. The first flip-flop 308 receives the second input clock signal $CLK_{IN2}$ at its input terminal between the seventh and ninth time instances $t_6$ and $t_8$. The first flip-flop 308 retains a low logic state during the subsequent clock cycle of the first input clock signal $CLK_{IN1}$, i.e., from the ninth time instance $t_8$ to the eleventh time instance $t_{10}$. Hence, the second input clock signal $CLK_{IN2}$ has a time period from the fifth time instance $t_4$ to the eleventh time instance $t_{10}$, i.e., thrice a time period of the first input clock signal $CLK_{IN1}$.

The critical time TC of the multi-modulus frequency divider circuit 200 is less as compared to a critical time of conventional frequency division circuits. This facilitates accurate operation for high frequency division. Hence, the multi-modulus frequency divider circuit 200 can be employed in high speed circuits, as the output clock signal $CLK_{OUT}$ accurately samples the serial data.

Figure 8:
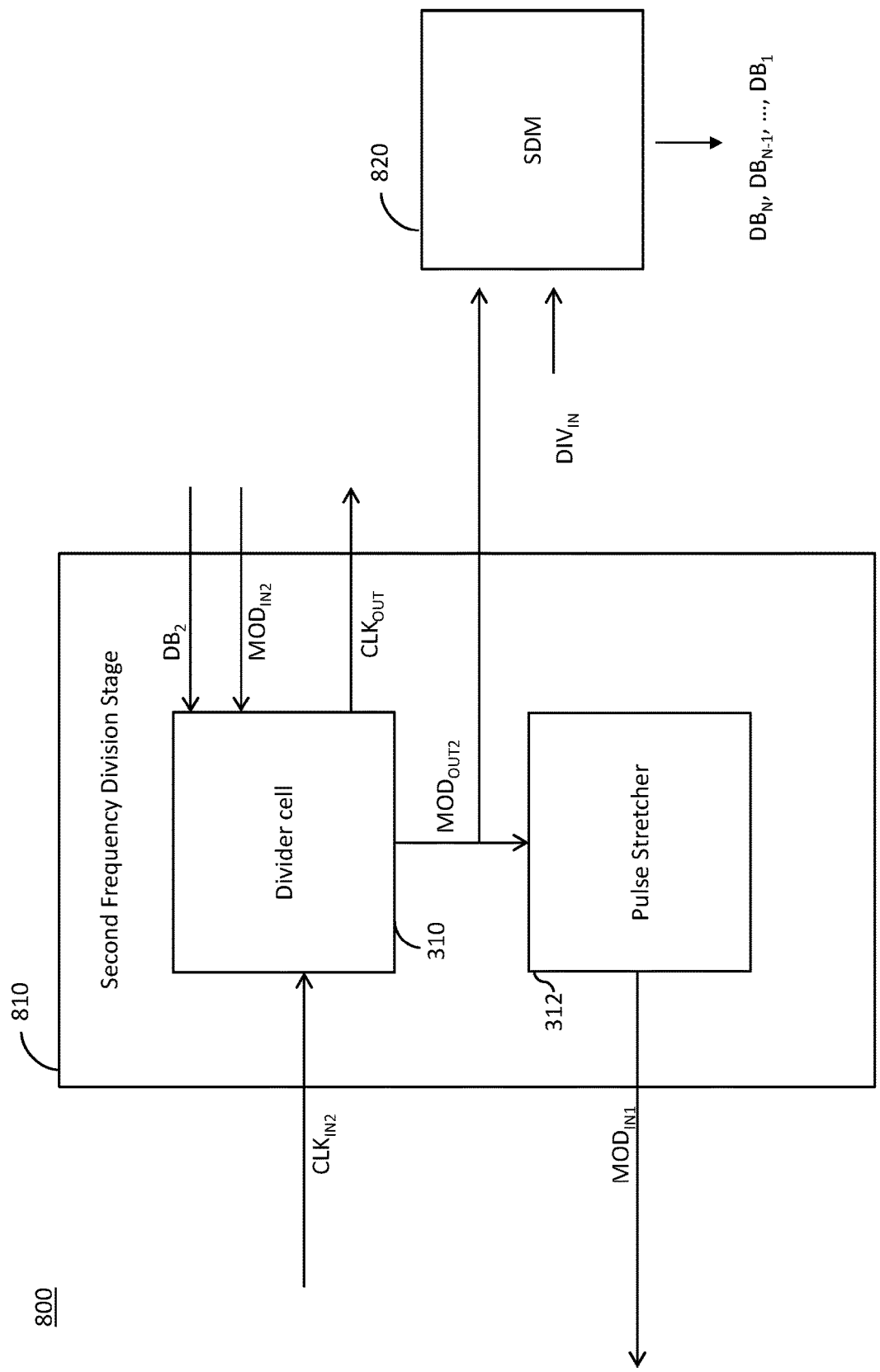
FIG. 8 is a schematic block diagram of a second frequency division stage and a sigma-delta modulator of a multi-modulus frequency divider circuit, in accordance with an example embodiment.

FIG. 8 is a schematic block diagram of a second frequency division stage 810 and a sigma-delta modulator (SDM) 820 of a multi-modulus frequency divider circuit 800, in accordance with an embodiment of the present disclosure. The multi-modulus frequency divider circuit 800 shown in FIG. 8 is an embodiment of the multi-modulus frequency divider 200, shown in FIG. 2, with N frequency division stages and configured to perform fractional frequency division, such that the division factor may be a non-integer value. The multi-modulus frequency divider circuit 800 performs dynamic frequency division, such that the input signal's frequency is dynamically divided by a division factor that may change over time, according to some embodiments. In some embodiments, N is greater than 2.

The multi-modulus frequency divider 800 includes the first frequency division stage 202, shown in FIG. 4, connected to the second frequency division stage 810. The first frequency division stage 202 provides the second input clock signal $CLK_{IN2}$ to the second frequency division stage 810. The first frequency division stage 202 receives the first input modulus signal $MOD_{IN1}$ from the second frequency division stage 810. The first set of flip-flops 402 in the first frequency division stage 202 also receives a sequence of division bits $DB_{N-1}$, $DB_{N-2}$, ..., $DB_0$ (also referred to herein as the set of division bits) from the SDM 820.

The second frequency division stage 810 is an embodiment of the second frequency division stage 204 shown in FIG. 3. As shown in FIG. 3, the divider cell 310 in the second frequency division stage 204 is connected to the first flip-flop (not shown) in the first frequency division stage to receive the second input clock signal $CLK_{IN2}$. The divider cell 310 further receives the second division bit $DB_2$ and the second modulus input signal $MOD_{IN2}$ from an adjacent frequency division stage. If the divider cell 310 is part of the last frequency division stage in the chain of frequency division stages of the multi-modulus frequency divider circuit 200, the second division bit $DB_2$ and the second modulus input signal $MOD_{IN2}$ are set to 1. Based on the second input clock signal $CLK_{IN2}$, the second modulus input signal $MOD_{IN2}$, and the second division bit $DB_2$, the divider cell 310 generates a second modulus output signal $MOD_{OUT2}$, and the output clock signal $CLK_{OUT}$ at the output oscillating frequency. The output clock signal $CLK_{OUT}$ is received by the next frequency division stage of the multi-modulus frequency divider circuit 800, or is provided as an output of the multi-modulus frequency divider circuit 800, if the second frequency division stage 810 is the final frequency division stage in the multi-modulus frequency divider circuit 800.

The second modulus output signal $MOD_{OUT2}$ is received by the pulse stretcher 312 and also the SDM 820. The divider cell 310 and the pulse stretcher 312 are the same as the divider cell 310 and the pulse stretcher 312 shown in FIG. 2. The SDM 820 also receives an input division factor signal $DIV_{IN}$. The SDM 820 generates a sequence of division bits $DB_N$, $DB_{N-1}$, ..., $DB_1$ based on the second modulus output signal $MOD_{OUT2}$ and the input division factor signal $DIV_{IN}$, both of which may be dynamic, time-varying signals. Each of the N frequency division stages of the multi-modulus frequency divider circuit 800 receives a division bit from the sequence of division bits $DB_N$, $DB_{N-1}$, ..., $DB_1$. For example, the first frequency division stage 202 receives the first division bit $DB_1$, and the second frequency division stage 810 receives the second division bit $DB_2$. In cases where there are more than two frequency division stages, the third frequency division stage receives the third division bit $DB_3$, the fourth frequency division stage receives the fourth division bit $DB_4$, and likewise up to the Nth frequency division stage which receives the Nth division bit $DB_N$. The first division bit $DB_1$ may represent the least significant bit of the division factor in binary representation, and the Nth division bit $DB_N$ may represent the most significant bit of the division factor in binary representation, according to some embodiments.

The multi-modulus frequency divider circuit 800 is capable of dividing the frequency of an input clock signal by a fractional division factor. Additionally, the division factor may change during the operation of the multi-modulus frequency divider circuit 800, based on the input division factor signal $DIV_{IN}$ and the second modulus input signal $MOD_{IN2}$.

Figure 9:
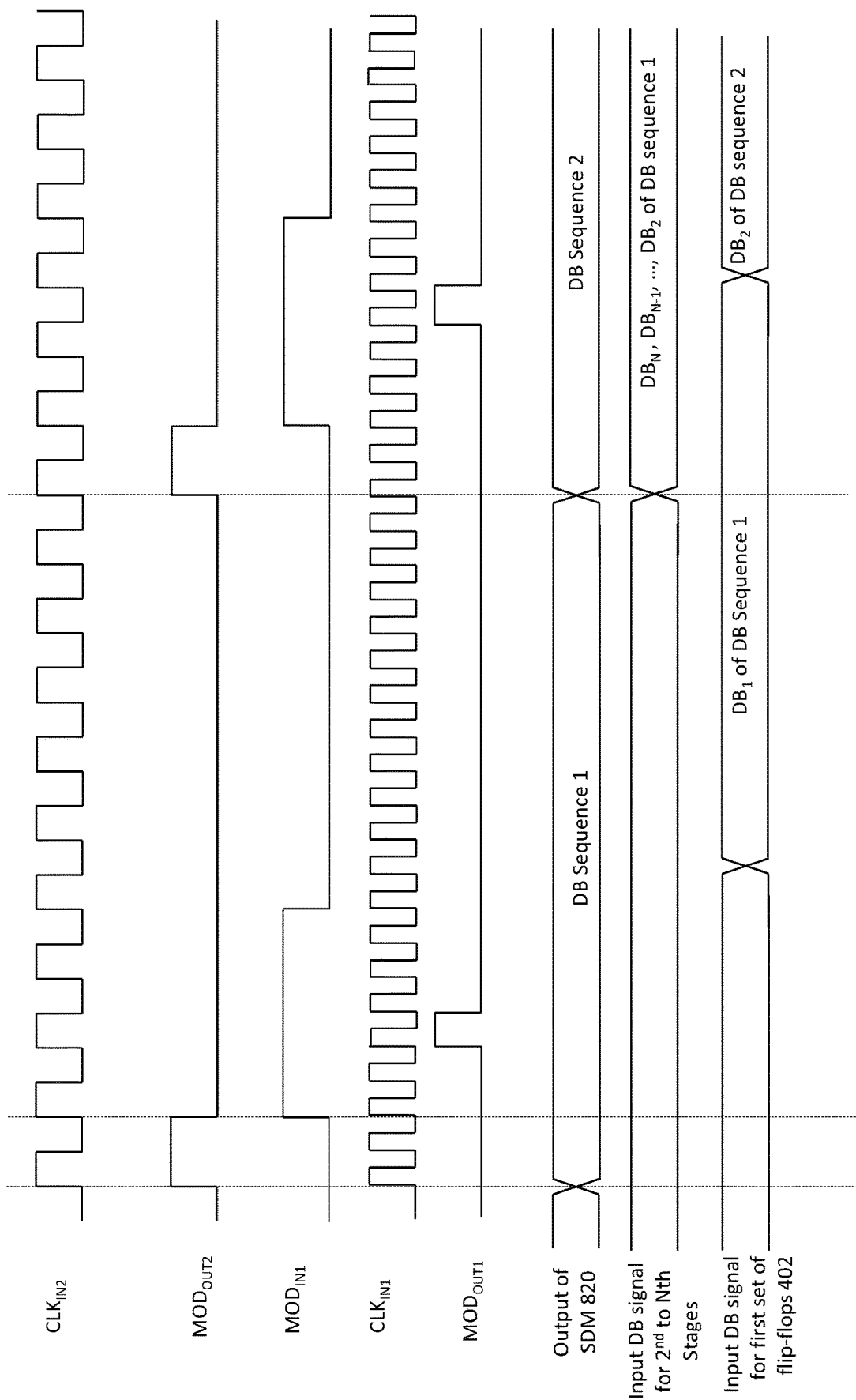
FIG. 9 illustrates a timing diagram illustrating various signals of the multi-modulus frequency divider circuit partly shown in FIG. 8, in accordance with an example embodiment.

FIG. 9 illustrates a timing diagram illustrating various signals of the multi-modulus frequency divider circuit 800 partly shown in FIG. 8, in accordance with an embodiment of the present disclosure. The timing diagram shows the second input clock signal $CLK_{IN2}$, the second output modulus signal $MOD_{OUT2}$, the first input modulus signal $MOD_{IN1}$, the first input clock signal $CLK_{IN1}$, the first output modulus signal $MOD_{OUT1}$, the output of the SDM 820, the input division bit (DB) signal provided to the $2^{nd}$ to Nth frequency division stages of the multi-modulus frequency divider circuit 800, and the input DB signal for the first set of flip flops 402.

The input DB signal for the first set of flip-flops 402 is held at its previous value until a time-delay period after the first output modulus signal $MOD_{OUT1}$ switches to a high logic state. This may ensure that all of the frequency division stages receive the correct input (e.g., $DB_1$, $DB_2$, ..., $DB_N$) at the correct time. For example, the SDM 820 may output a first sequence of division bits (DB Sequence 1) which outputs the first division bit $DB_1$ of DB Sequence 1 earlier in the sequence than the other division bits in DB Sequence 1. The first division bit $DB_1$ of DB Sequence 1 is provided to the first set of flip-flops 402 after a delay to ensure that all of the frequency division stages are receiving a corresponding bit of division bit of DB Sequence 1 at the next time when the second modulus output signal $MOD_{OUT2}$ switches to a high logic state after DB Sequence 1 is generated by the SDM 820.

During a period of operation, the SDM 820 may output a sequence of division bits (e.g., DB sequence 1 or DB Sequence 2). When the division factor for the multi-modulus frequency 800 changes during a period of operation, output of the SDM 820 may also change. For example, as shown in FIG. 9, the SDM 820 may output DB sequence 1 during a first period of operation and output DB Sequence 2 during the second period of operation. DB Sequence 2 may correspond to a different division factor of the multi-modulus frequency divider circuit 800 than that of DB Sequence 1. The output of the SDM 820 is based on the input division factor signal $DIV_{IN}$. As a result, the multi-modulus frequency divider circuit 800 may divide the input clock signal $CLK_{IN1}$ by a different division factor during different operation periods (e.g. a first operation period and a second operation period).

The multi-modulus frequency divider circuit 800 partially shown in FIG. 8 is capable of handling fractional division factors, in addition to having the performance benefits of the multi-modulus frequency divider circuit 200 shown in FIGS. 2-5. Additionally, the multi-modulus frequency divider circuit 800 may stably perform dynamic frequency division, such that the division factor of the multi-modulus frequency divider circuit 800 changes over time, based on the second modulus input signal $MOD_{IN1}$ and the input division factor signal $DIV_{IN}$. Due in part to the improved operational speed and relaxed timing requirements of the multi-modulus frequency divider circuit 800 compared to conventional frequency divider circuits, the multi-modulus frequency divider circuit 800 may perform dynamic frequency division with higher accuracy than conventional frequency divider circuits.

The terms high and low logic states have been used herein to distinguish before high and low signals. For example, the low logic state could signify a signal that is 0V while a high logic state would then indicate a signal that has a logical '1' value, with the actual voltage value for logic 1 depending on circuit technology. The circuits described herein also can be designed using either positive or negative logic, so an active signal in one embodiment could be a logic '0' and an inactive signal would then have a logic value of '1'.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

What is claimed is:

1. A multi-modulus frequency divider circuit, comprising:
   a first frequency division stage comprising:
      a modulus generation circuit configured to receive a first division bit of a set of division bits, a first input clock signal at a first oscillating frequency, and a first modulus input signal, and generate a first modulus output signal, wherein each division bit of the set of division bits corresponds to one of a set of division ratios, and
      a first flip-flop configured to receive a delayed version of the first input clock signal and a first flip-flop input signal, and generate a second input clock signal at a second oscillating frequency, the second oscillating frequency equal to the first oscillating frequency divided by the division ratio, wherein the first flip-flop input signal is generated based on the first modulus output signal; and
   a second frequency division stage, comprising:
      a divider cell configured to receive a second division bit of the set of division bits, a second modulus input signal, and the second input clock signal, and configured to generate an output clock signal at an output oscillating frequency by dividing the second oscillating frequency by the division ratio corresponding to the second division bit.

2. The multi-modulus frequency divider circuit of claim 1, wherein the first frequency division stage further comprises:
   a first logic gate that is connected to the modulus generation circuit and configured to receive the first modulus output signal and to output the first flip-flop input signal to the first flip-flop.

3. The multi-modulus frequency divider circuit of claim 1, wherein the modulus generation circuit comprises:
   a first set of flip-flops configured to receive the first division bit and the first input clock signal, and to generate a first division output signal;
   a second set of flip-flops configured to receive the first input clock signal, to receive the first modulus input signal from the second frequency division stage, and to generate first and second flip-flop output signals;
   a second logic gate that is connected to the second set of flip-flops and configured to receive the first and second flip-flop output signals, and to output a pulse signal; and
   a second flip-flop configured to receive the first input clock signal, to receive the first division output signal from the first set of flip flops, to receive the pulse signal from the second logic gate, and to generate the first modulus output signal.

4. The multi-modulus frequency divider circuit of claim 3, wherein the first set of flip-flops comprises third through fifth flip-flops that are connected serially, wherein the third flip-flop receives the first division bit, wherein the fifth flip-flop generates the first division output signal, and wherein each of the third through fifth flip-flops receives the first input clock signal.

5. The multi-modulus frequency divider circuit of claim 3, wherein the second set of flip-flops comprises third through fifth flip-flops that are connected serially, wherein the fourth flip-flop generates the first flip-flop output signal, wherein the fifth flip-flop generates the second flip-flop output signal, and wherein each of the third through fifth flip-flops receives the first input clock signal.

6. The multi-modulus frequency divider circuit of claim 1, wherein the divider cell comprises:
   a second flip-flop connected to the first frequency division stage and configured to receive the second input clock signal and generate a second modulus output signal;
   a second logic gate configured to receive the second division bit, to receive the second modulus output signal from the second flip flop, and to output a first AND output signal;
   a third logic gate configured to receive the output clock signal, to receive the first AND output signal from the second logic gate, and to output a second flip-flop input signal;
   a third flip-flop connected to the third logic gate to receive the second flip-flop input signal, connected to the first frequency division stage to receive the second input clock signal, and configured to generate the output clock signal; and
   a fourth logic gate configured to receive the second modulus input signal, to receive the output clock signal from the third flip flop, and to output a second AND output signal, wherein the second flip-flop generates the second modulus output signal based on the second AND output signal.

7. The multi-modulus frequency divider circuit of claim 1, wherein the first frequency division stage further comprises a buffer configured to receive the first input clock signal, delay the first input clock signal by a propagation delay time, and generate the delayed version of the first input clock signal.

8. The multi-modulus frequency divider circuit of claim 1, wherein the divider cell is further configured to generate a second modulus output signal, and the first modulus input signal is generated based on the second modulus output signal.

9. The multi-modulus frequency divider circuit of claim 8, wherein the second frequency division stage further comprises:
a pulse stretcher that is connected to the divider cell to receive the second modulus output signal, and the pulse stretcher configured to generate the first modulus input signal based on the second modulus output signal.

10. The multi-modulus frequency divider circuit of claim 1, wherein a critical time of the multi-modulus frequency divider circuit is equal to a sum of a delay time and a setup time of the first flip-flop.

11. The multi-modulus frequency divider circuit of claim 1, wherein the multi-modulus frequency divider circuit is integrated into a phase locked loop (PLL) circuit, and the output clock signal is provided to the PLL circuit.

12. The multi-modulus frequency divider circuit of claim 1, wherein the multi-modulus frequency divider circuit is integrated into a synchronous circuit, and the output clock signal is a clock signal for sampling data received by the synchronous circuit.

13. The multi-modulus frequency divider circuit of claim 1, wherein the second frequency division stage further comprises a sigma-delta modulator (SDM) connected to the divider cell, the SDM configured to generate the set of division bits.

14. The multi-modulus frequency divider circuit of claim 13, wherein the first division bit is received by the modulus generation circuit from the SDM after a time-delay period after the first modulus output signal switches from a logic low value to a logic high value higher than the logic low value.

15. A multi-modulus frequency divider circuit, comprising:
a first frequency division stage comprising:
a modulus generation circuit configured to receive a first input clock signal at a first oscillating frequency and a first division bit of a set of division bits, each division bit of the set of division bits corresponding to one of a set of division ratios;
a flip flop connected to the modulus generation circuit and configured to output a second input clock signal, the second input clock signal having a second oscillating frequency equal to the first oscillating frequency divided by the division ratio corresponding to the first division bit, wherein a critical time of the multi-modulus frequency divider circuit is a sum of a delay time and a setup time of the flip-flop; and
a second frequency division stage configured to receive a second division bit of the set of division bits and the second input clock signal, and configured to generate an output clock signal, the output clock signal having an output oscillating frequency equal to the second oscillating frequency divided by the division ratio corresponding to the second division bit.

16. The multi-modulus frequency divider circuit of claim 15, wherein the first frequency division stage further comprises a buffer configured to receive the first input clock signal, delay the first input clock signal by a propagation delay time, and generate the delayed version of the first input clock signal.

17. The multi-modulus frequency divider circuit of claim 15, wherein the modulus generation circuit is further configured to generate a first modulus output signal, and the first frequency division stage further comprises:
a logic gate that is connected to the modulus generation circuit and is configured to receive the first modulus output signal and output a first flip-flop input signal to the flip-flop.

18. The multi-modulus frequency divider circuit of claim 17, wherein the modulus generation circuit comprises:
a first set of flip-flops configured to receive the first division bit of the set of division bits and the first input clock signal, and to generate a first division output signal; and
a second flip-flop configured to receive the first input clock signal, to receive the first division output signal from the first set of flip flops, and to generate the first modulus output signal.

19. The multi-modulus frequency divider circuit of claim 15, wherein the second frequency division stage comprises a divider cell configured to:
receive the second division bit of the set of division bits, a second modulus input signal, and the second input clock signal; and
generate the output clock signal at the output oscillating frequency by dividing the second oscillating frequency by the division ratio corresponding to the second division bit.

20. The multi-modulus frequency divider circuit of claim 19, wherein the divider cell is further configured to generate a second modulus output signal.

21. The multi-modulus frequency divider circuit of claim 20, wherein the second frequency division stage further comprises:
a pulse stretcher configured to receive a second modulus output signal from the divider cell, and to increase a duty cycle of the second modulus output signal to generate a first modulus input signal for transmission to the modulus generation circuit.

22. The multi-modulus frequency divider circuit of claim 15, wherein the multi-modulus frequency divider circuit is integrated into a phase locked loop (PLL) circuit, and the output clock signal is a clock signal for sampling data received by the PLL circuit.

23. The multi-modulus frequency divider circuit of claim 15, wherein the second frequency division stage further comprises a sigma-delta modulator (SDM) connected to the divider cell, the SDM configured to generate the set of division bits.

24. The multi-modulus frequency divider circuit of claim 15, wherein the first division bit is received by the modulus generation circuit from the SDM after a time-delay period after the first modulus output signal switches from a logic low value to a logic high value higher than the logic low value.

25. A non-transitory computer-readable storage medium comprising stored instructions for generating a digital representation of an integrated circuit, the integrated circuit comprising:
a first frequency division stage comprising:
a modulus generation circuit configured to receive a first division bit of a set of division bits, a first input clock signal at a first oscillating frequency, and a first modulus input signal, and generate a first modulus output signal, wherein each division bit of the set of division bits corresponds to one of a set of division ratios, and
a first flip-flop configured to receive a delayed version of the first input clock signal and a first flip-flop input signal, and generate a second input clock signal at a second oscillating frequency, the second oscillating frequency equal to the first oscillating frequency divided by the division ratio, wherein the first flip-flop input signal is generated based on the first modulus output signal; and a second frequency division stage, comprising:
- a divider cell configured to receive a second division bit of the set of division bits,
  - a second modulus input signal, and the second input clock signal, and
  - configured to generate an output clock signal at an output oscillating frequency by dividing the second oscillating frequency by the division ratio corresponding to the second division bit.

* * * * *